(12) United States Patent
Hyacinthe et al.

(10) Patent No.: US 9,354,033 B2
(45) Date of Patent: May 31, 2016

(54) SMART ELECTROMAGNETIC SENSOR ARRAY

(71) Applicant: Fluke Corporation, Everett, WA (US)

(72) Inventors: John Wesley Hyacinthe, Lake Stevens, WA (US); Jaroslaw Bras, Mill Creek, WA (US)

(73) Assignee: Fluke Corporation, Everett, WA (US)

( * ) Notice: Subject to any disclaimer, the term of this patent is extended or adjusted under 35 U.S.C. 154(b) by 239 days.

(21) Appl. No.: 13/679,819

(22) Filed: Nov. 16, 2012

(65) Prior Publication Data

US 2013/0127448 A1 May 23, 2013

Related U.S. Application Data

(60) Provisional application No. 61/561,781, filed on Nov. 18, 2011.

(51) Int. Cl.
| | |
|---|---|
| *G01B 7/14* | (2006.01) |
| *G01B 7/00* | (2006.01) |
| *G01R 33/00* | (2006.01) |
| *G01V 3/10* | (2006.01) |
| *G01V 3/15* | (2006.01) |

(52) U.S. Cl.
CPC .............. *G01B 7/00* (2013.01); *G01R 33/0094* (2013.01); *G01V 3/10* (2013.01); *G01V 3/15* (2013.01)

(58) Field of Classification Search
CPC ..... G01P 3/488; G01D 5/2013; G01D 5/2033
USPC .............. 324/207.13, 207.15, 207.16, 207.17
See application file for complete search history.

(56) References Cited

U.S. PATENT DOCUMENTS

| | | | | |
|---|---|---|---|---|
| 3,938,150 | A * | 2/1976 | Phillips | ...................... G01S 7/40 342/169 |
| 4,806,869 | A * | 2/1989 | Chau | ......................... E21B 7/04 175/45 |
| 5,559,498 | A * | 9/1996 | Westrick | .............. A01K 15/023 119/721 |
| 6,008,651 | A * | 12/1999 | Mercer | ............. E21B 47/02224 324/326 |
| 6,411,094 | B1 * | 6/2002 | Gard | ........................ E21B 44/00 175/45 |
| 6,496,008 | B1 * | 12/2002 | Brune | ................... E21B 47/024 175/45 |
| 6,940,289 | B2 | 9/2005 | Hyacinthe et al. | |
| 7,443,154 | B1 * | 10/2008 | Merewether | ........... G01V 3/104 324/326 |
| 7,939,338 | B2 * | 5/2011 | Wang | ............................ 210/222 |
| 2002/0047709 | A1 * | 4/2002 | Fling | ...................... G01V 3/104 324/326 |
| 2004/0130323 | A1 * | 7/2004 | Oohashi | ................. B82Y 25/00 324/252 |
| 2007/0210792 | A1 * | 9/2007 | Wakui | ..................... B82Y 25/00 324/252 |
| 2008/0134727 | A1 * | 6/2008 | May | ........................ G01D 5/145 68/12.02 |
| 2009/0023408 | A1 * | 1/2009 | Someya | ................... H04B 1/24 455/200.1 |
| 2009/0189603 | A1 * | 7/2009 | Sherman | ............ G01R 33/0206 324/247 |

(Continued)

*Primary Examiner* — Tung X Nguyen
*Assistant Examiner* — Dominic Hawkins
(74) *Attorney, Agent, or Firm* — Seed IP Law Group PLLC

(57) ABSTRACT

An array of induction coil sensors is used to monitor, from multiple locations, the strength of a magnetic field generated by a wire to be traced. The magnetic field strength data is used to determine the location and orientation of the wire. In one embodiment, the sensor array is incorporated into a test instrument. The screen of the test instrument provides a graphical user interface that shows the orientation of the wire and indicates the location of the wire relative to the instrument.

22 Claims, 21 Drawing Sheets

(56) References Cited

U.S. PATENT DOCUMENTS

| | | | |
|---|---|---|---|
| 2010/0295691 A1* | 11/2010 | King, Jr. | H01R 4/22 340/635 |
| 2010/0301796 A1* | 12/2010 | Vannier | H02P 25/027 318/686 |
| 2011/0109437 A1* | 5/2011 | Olsson | G01V 3/15 340/8.1 |
| 2011/0191058 A1* | 8/2011 | Nielsen | B65D 83/203 702/130 |
| 2012/0015419 A1* | 1/2012 | Laugharn, Jr. | B01F 11/0283 435/173.7 |

* cited by examiner

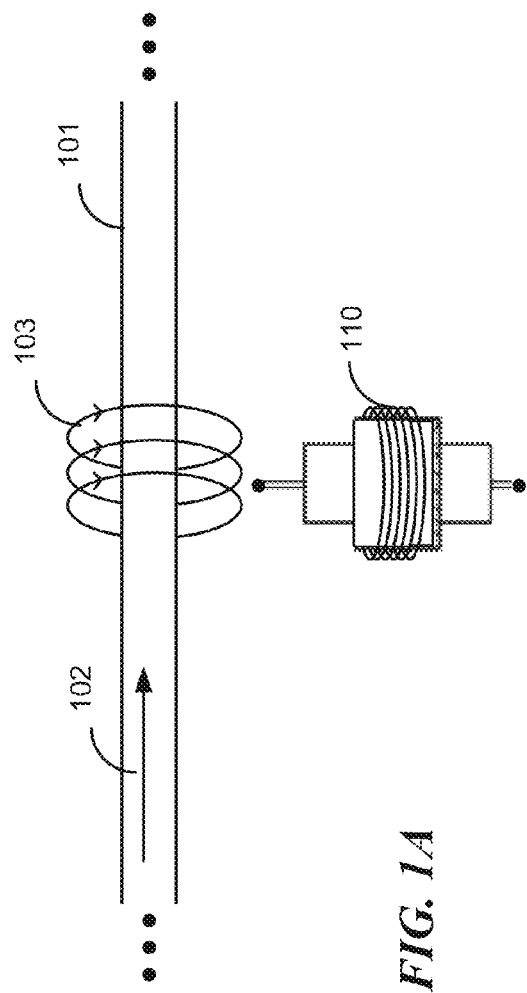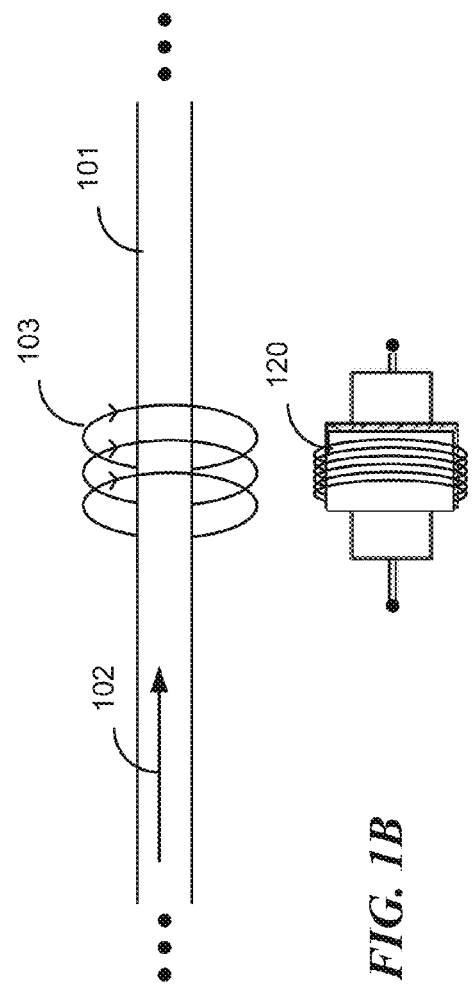

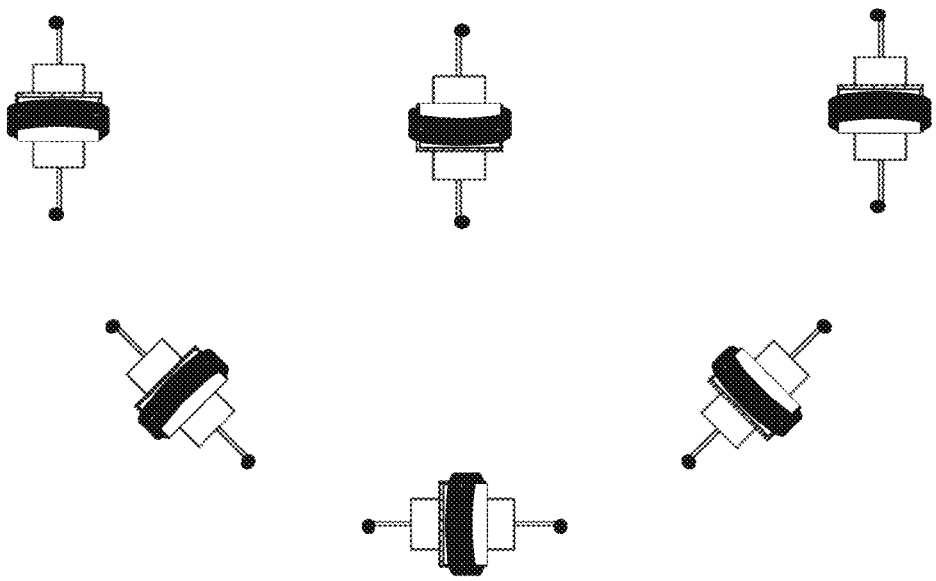

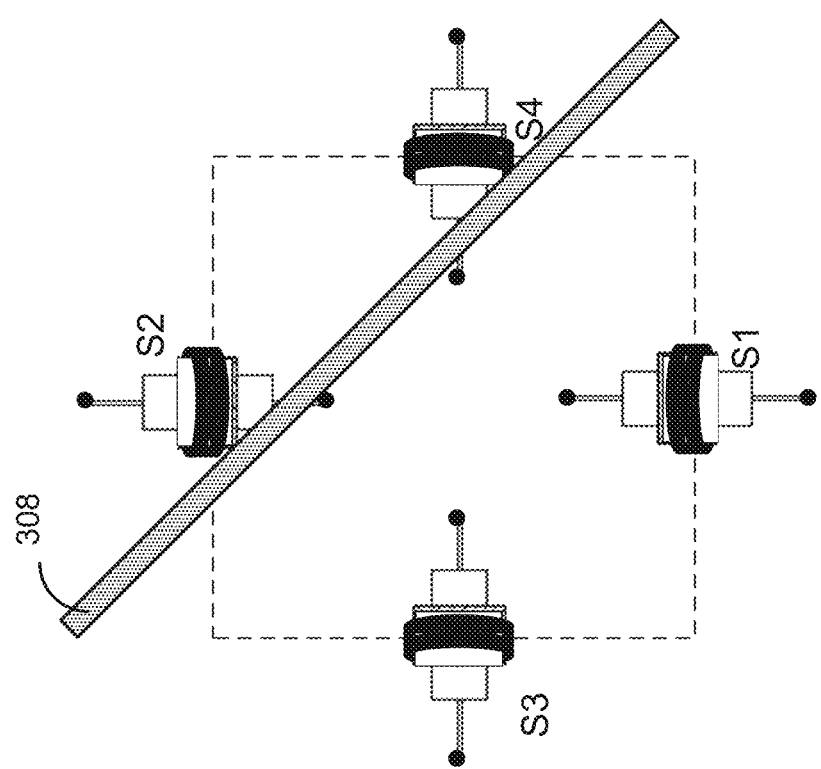

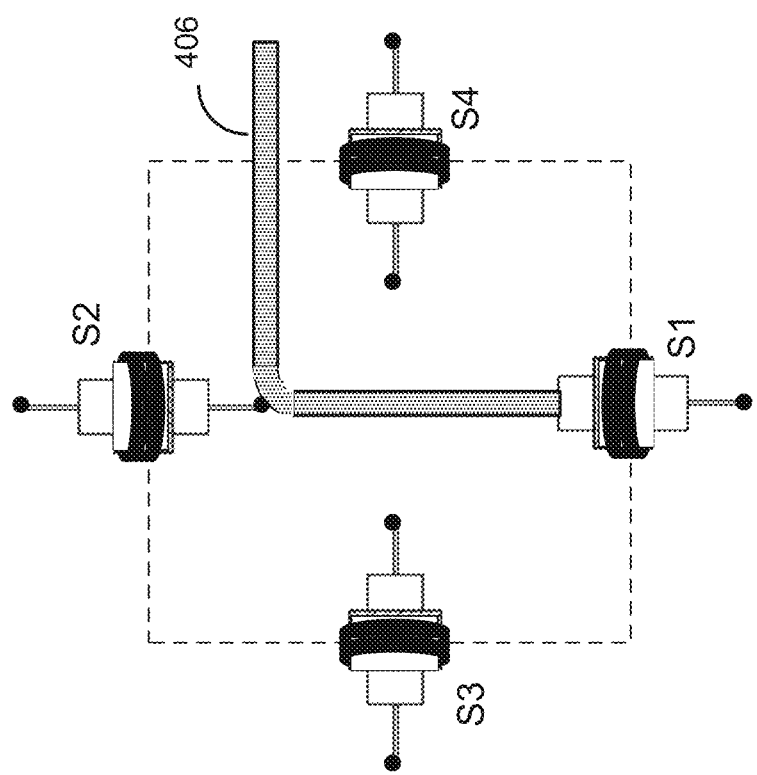

SMART ELECTROMAGNETIC SENSOR ARRAY

CROSS-REFERENCE TO RELATED APPLICATION

This application claims priority to U.S. Provisional Patent Application No. 61/561,781, filed Nov. 18, 2011, the disclosure of which is incorporated by reference herein in its entirety.

SUMMARY

An array of induction coil sensors is used to monitor, from multiple locations, the strength of a magnetic field generated by a wire to be traced. The magnetic field strength data is used to determine the location and orientation of the wire. In one embodiment, the sensor array is incorporated into a test instrument. The screen of the test instrument provides a graphical user interface that shows the orientation of the wire and indicates the location of the wire relative to the instrument.

BRIEF DESCRIPTION OF THE DRAWINGS

Examples of a system and method for detecting the location and orientation of a wire are illustrated in the figures. The examples and figures are illustrative rather than limiting.

FIGS. 1A and 1B illustrate two cases where an induction coil sensor is brought close to an energized wire.

FIGS. 2A-2E show example configurations of induction coil sensors that can be used in an electromagnetic sensor array.

FIGS. 3A-3D show example straight wire configurations that a four-coil sensor array may encounter.

FIGS. 4A-4C show example bent wire configurations that a four-coil sensor array may encounter.

DETAILED DESCRIPTION

Figure 2A:
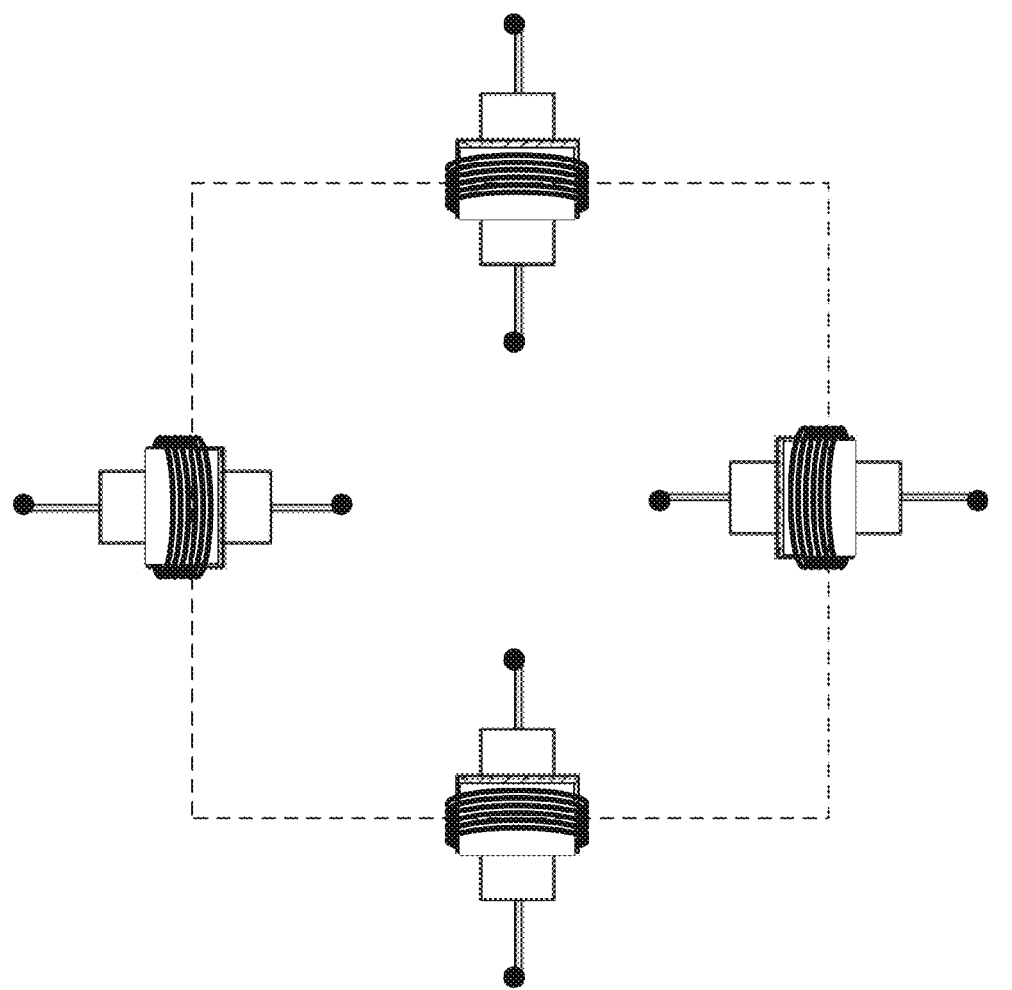

Various aspects and examples of the invention will now be described. The following description provides specific details for a thorough understanding and enabling description of these examples. One skilled in the art will understand, however, that the invention may be practiced without many of these details. Additionally, some well-known structures or functions may not be shown or described in detail, so as to avoid unnecessarily obscuring the relevant description.

The terminology used in the description presented below is intended to be interpreted in its broadest reasonable manner, even though it is being used in conjunction with a detailed description of certain specific examples of the technology. Certain terms may even be emphasized below; however, any terminology intended to be interpreted in any restricted manner will be overtly and specifically defined as such in this Detailed Description section.

According to Faraday's law of induction, the induced electromotive force in a circuit is equal to the rate at which the flux through the circuit is changing. This principle can be used to determine the location and orientation of a wire that carries a distinct modulated signal. FIGS. 1A and 1B illustrate two cases where an induction coil sensor is brought close to an energized wire. In both figures, a wire 101 is energized by a modulated signal 102 which has an accompanying magnetic field 103. In FIG. 1A, an induction coil sensor 110 is brought close to the magnetic field generated by the wire. The coil sensor 110 is oriented perpendicular to the wire 101 such that the generated magnetic field 103 passes through the center of the coil 110 along the axis of the coil 110. When a time-varying magnetic field 103 passes through the coil 110, a current proportional to the magnetic field 103 is generated in the wire of the coil 110. Thus, the coil effectively senses the energized wire.

In FIG. 1B, an induction coil sensor 120 is located close to the magnetic field 103 generated by the wire 101. However, the coil sensor 120 is oriented parallel to the wire 101 so that the generated magnetic field 103 does not pass through the center of the coil 120. As a result, no current is generated in the wire of the coil 120 for this configuration. If the coil is oriented at an angle to the wire, a current will be generated in the wire of the coil, but less than the amount generated when the coil is perpendicular to the wire.

Conventional wire tracers use a single coil sensor to sense the presence of an energized wire and provide the signal strength of the sensed magnetic field to the user. When the wire tracer with the coil is brought closer to the wire, the signal strength increases. However, because only a single coil sensor is used, the conventional wire tracer cannot provide any information about the orientation or position of the wire. Consequently, the user essentially conducts a blind search when attempting to locate the wire. Moreover, there is frequently electromagnetic noise present which can further confuse the user of a conventional wire tracer.

As disclosed herein, when an array of coil sensors is used to detect the magnetic field generated by a wire, it is possible to not only locate a wire but also to determine the orientation of the wire. FIGS. 2A-2E show example configurations of induction coil sensors that can be used in an electromagnetic sensor array.

FIG. 2A shows one embodiment of an array of sensors where four coils are used. Each coil is located at the mid-point of a side of a virtual square (shown with a dotted line), and the coils are oriented such that the axis of each coils is perpendicular to the side of the square on which it is located.

Figure 2B:
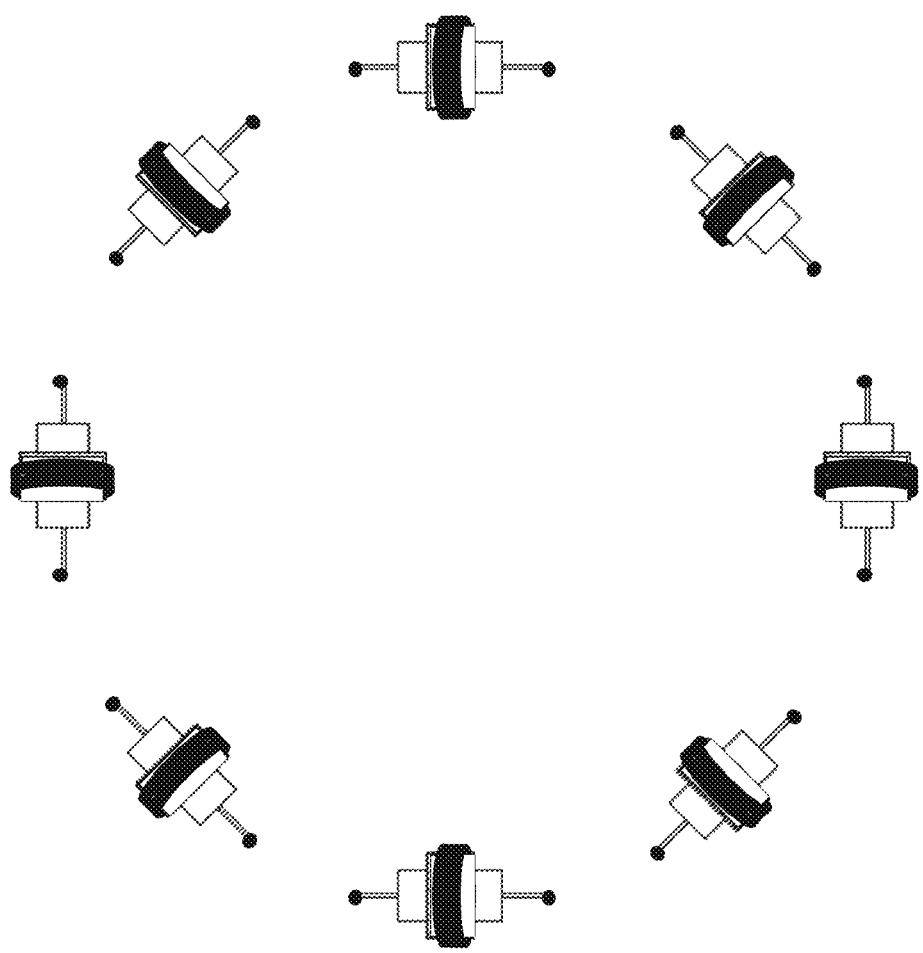

FIG. 2B shows one embodiment of an array of sensors where eight coils are used. The coils are spaced equally around a circle, and the coils are oriented such that the axis of each coil is parallel to a tangent to the circumference of the circle.

Figure 2C:
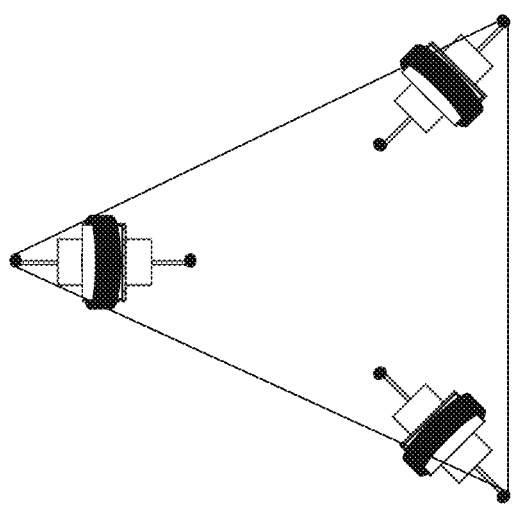

FIG. 2C shows one embodiment of an array of sensors where three coils are used. The coils are located at the corners of an equilateral triangle, and each coil is perpendicular to a virtual line between the center of the triangle and the corner of the triangle where the coil is situated.

FIG. 2D shows one embodiment of an array of sensors where six coils are used. Five of the coils are spaced equally around an arc, and the sixth coil is located at the center of the arc.

Figure 2E:
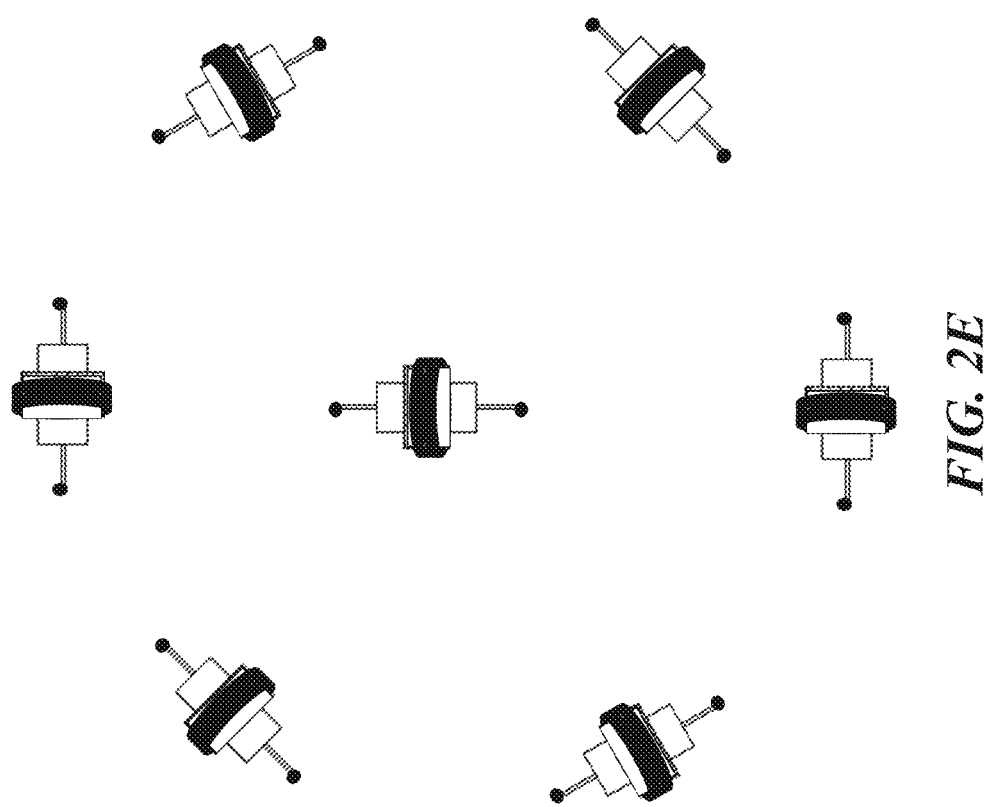

FIG. 2E shows one embodiment of an array of sensors where seven coils are used. Six of the coils are spaced equally around a circle, and the seventh coil is in the center of the circle.

The configurations shown in FIGS. 2A-2E are non-limiting examples of sensor arrays that can be used to sense the magnetic field of a wire to determine the location and orientation of the wire.

Experimentally, it was determined that the four-coil sensor array shown in FIG. 2A works well to sense the presence of a magnetic field within a full 360° in the plane of the array. Additionally, the four-coil sensor array also performs well at detecting a wire's magnetic field even when the strength of the field being sensed is rather high.

Figure 6:
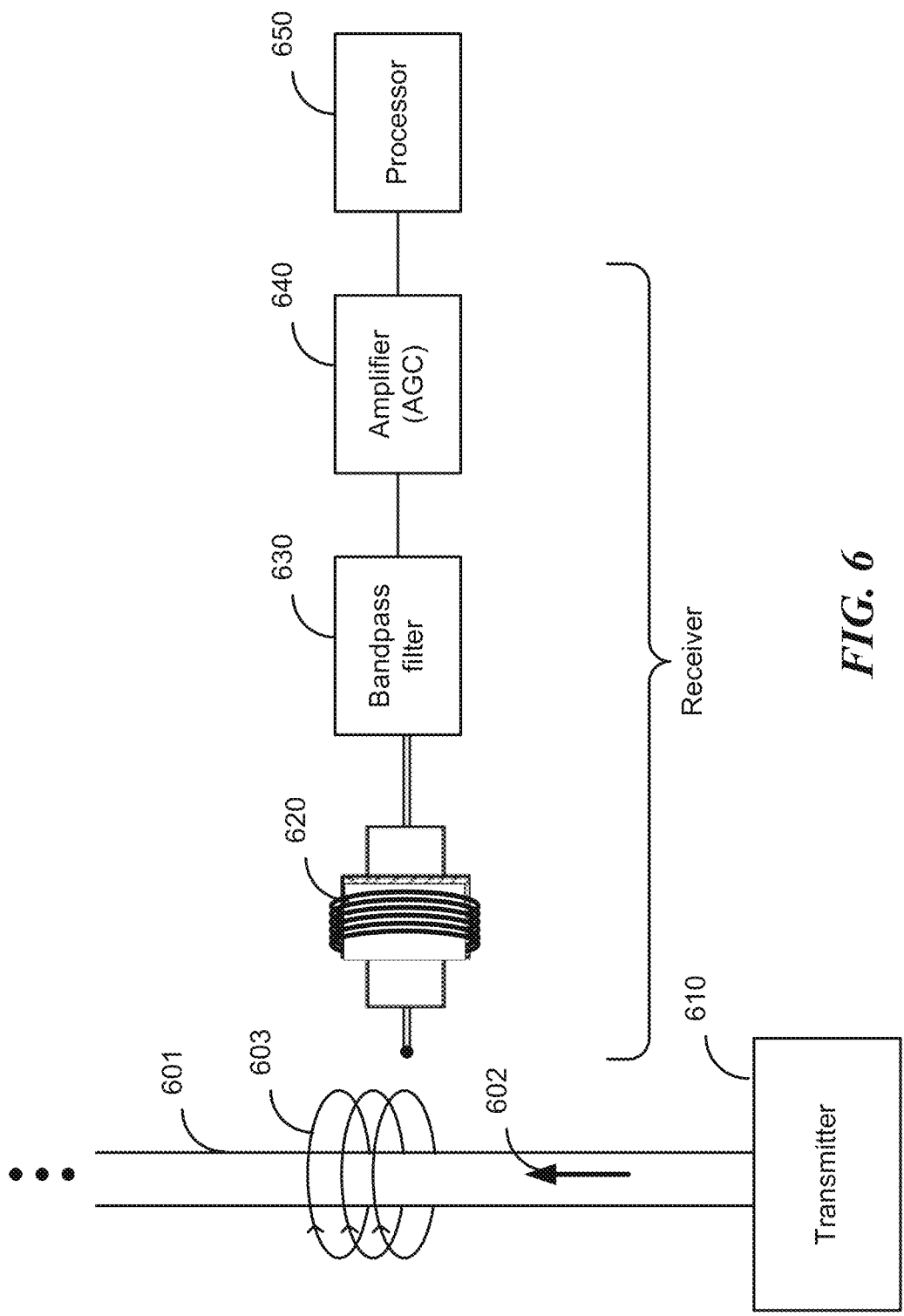
FIG. 6 shows a block diagram of the receiver of the signal induced in a coil by an energized wire.

FIG. 6 shows a block diagram of an example receiver of the current induced in a coil by an energized wire. In one embodiment, the receiver is incorporated into a test instrument that can be used to locate an energized wire. A transmitter 610 generates a distinct modulated signal 602 and injects it into the wire 601. For applications where direct contact with the wire is not possible, a clamp is used. The clamp enables the transmitter to induce its signal onto the wire to be detected. When the transmitter is plugged into the clamp, and the clamp is placed around the wire, the transmitter's signal is induced on top of any signal that may already be present on the wire, such as a 60 Hz or 50 Hz line frequency. The clamp acts like a 0.5 volt battery when clamped around the conducting wire. In a complete closed circuit, this voltage will cause approximately 80 mA of current to flow on top of the line frequency that is present. The signal is modulated at a predetermined frequency and optionally in a predetermined pattern and carried down the wire. For example, the signal can be modulated at 6 kHz in a pattern of bursts. In one embodiment, a first 62.5 ms burst of a 6 kHz modulated signal is followed by a second 62.5 ms burst. This pattern is repeated every 0.5 seconds in the transmitted signal.

The modulated signal 602 generates a magnetic field 603 that induces a current in the coil 620 if the coil is sufficiently close to the wire 601 and oriented to sense the magnetic field 603. The current induced in the coil 620 is passed through a bandpass filter 630 that is configured to only pass frequencies near the frequency of the signal sent by the transmitter. By passing only frequencies near that of the modulated signal, the current induced in the coil from other magnetic fields arising from other wires is eliminated. If a patterned signal is used in the wire, the filter 630 is chosen appropriately to allow the patterned signal to be transmitted.

The filtered signal is sent to an amplifier 640 to boost the signal before being processed by the processor 650. The amount of amplification provided by the amplifier 640 can be adjusted automatically by the processor 650, for example by using automatic gain control (AGC) circuitry, to ensure that the signal is near the middle of the operating range such that the signal is neither saturated nor too weak. In one embodiment, the user is also provided controls on a test instrument incorporating the sensor coil so that the user can manually adjust the gain of the signal from each coil. In this case, the user's adjustment will override the automatic gain settings provided by the instrument.

Only one coil is shown in FIG. 6. However, the current from each coil in a sensor array is filtered by a bandpass filter before being amplified and processed by the processor 650. The processor 650 receives all of the signals from each coil in the sensor array and uses those signals to determine the location and orientation of a sensed wire as described more fully below.

Figure 3A:
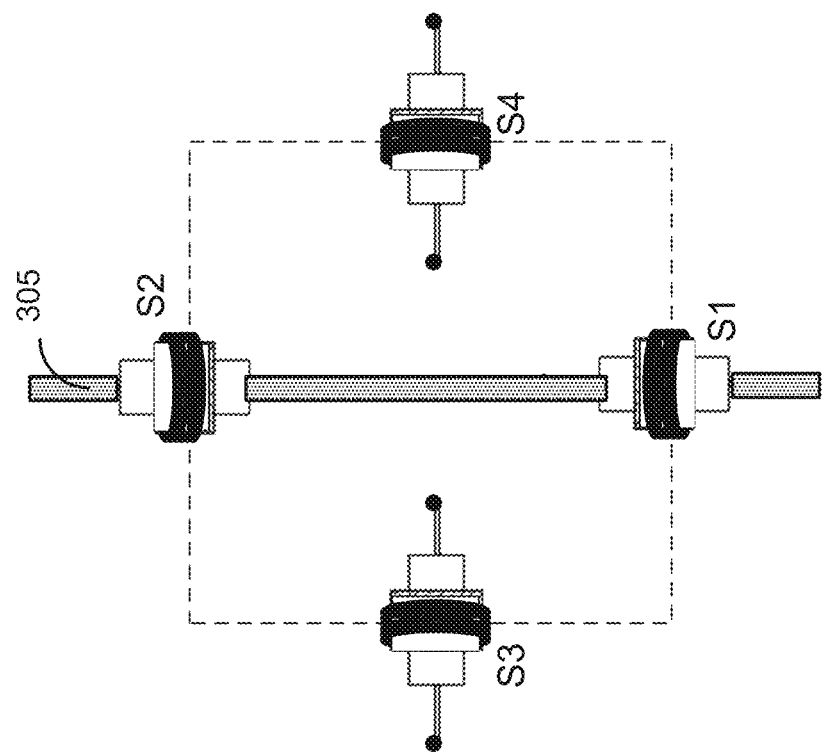

FIGS. 3A-3D show example wire configurations that the four-coil sensor array may encounter. In FIG. 3A, the sensor array includes four coil sensors labeled S1, S2, S3, and S4. The sensor array is positioned over a straight wire 305 running in the vertical direction directly underneath coils S1 and S2.

Figure 7A:
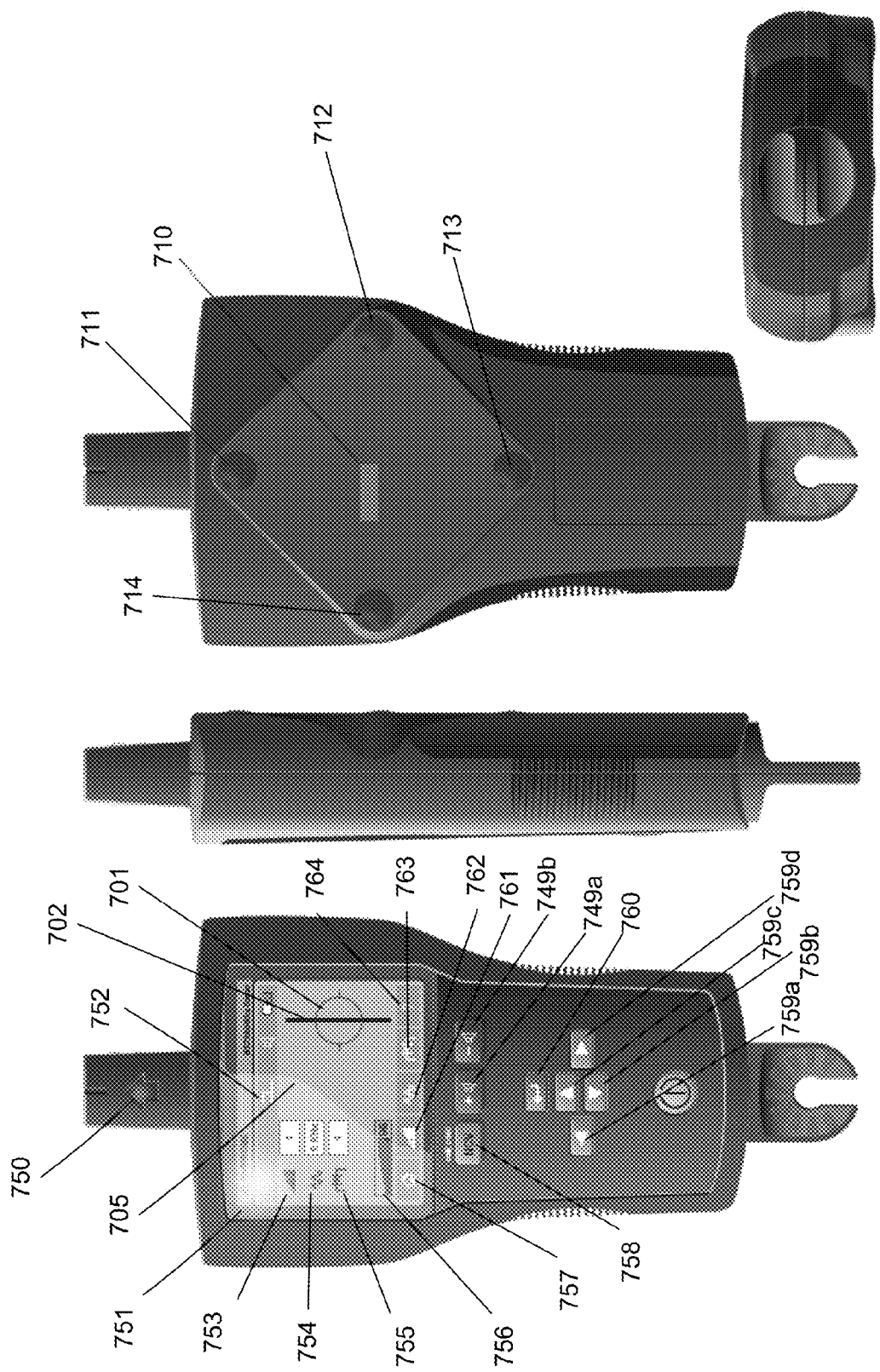
FIGS. 7A-7C show example test instrument perspectives and example screens indicating the location and orientation of an energized wire relative to the sensor array in the test instrument.

As discussed above, a distinct modulated signal is sent down the wire 305, and the processor receives the filtered signal from the coils. Prior to sensing the location of the wire in an unknown area, the gain of the receiver in the test instrument should be initialized. In the initialization procedure, the user injects the modulated signal into the wire and places the instrument near the energized wire, for example, within a few inches of the wire. FIG. 7A shows the sensor array 710 located on the back of the test instrument. The four circles 711, 712, 713, 714 located at the corners of the sensor array indicate where the coils are situated. Thus, the user places the back of the instrument closest to the wire. It is important to note that each coil should be independently initialized, and during the initialization procedure for each coil, the coil should be oriented perpendicular to the wire. So the initialization procedure for the four coils of the sensor array shown in FIG. 3A will involve rotating the test instrument 90° when initializing the receiver for coils S3 and S4 relative to the position of the test instrument when initializing the receiver for coils S1 and S2. Once the test instrument is oriented correctly for the receiver corresponding to a particular coil to be initialized, the processor in the instrument then automatically attempts to set the gain for each of the coils in the receiver to be in approximately the middle of the sensitivity range of the receiver.

In one embodiment, relative readings at each coil can be provided to the user to allow the user to initialize the receiver. For example, a maximum reading near the saturation level of the receiver for a coil can be assigned a 'high' or 'H' indicator, a reading near the middle of the receiver range can be assigned a 'mid' or 'M' indicator, and a reading that is zero (i.e., no magnetic field is measured) or registers a very weak signal can be assigned a 'low' or 'L' indicator. In another embodiment, the user may be provided a certain number of LEDs, for example a ten LED indicator, and the number of LEDs that light up corresponds to the strength of the magnetic field detected by the coil. The number of the LEDs can be categorized so that, for example, a reading of 6-10 lit LEDs corresponds to a high sensed field indication, 2-5 lit LEDs corresponds to a medium sensed field indication, and 0-1 lit LEDs corresponds to a low or no sensed field indication. A person of skill in the art will recognize that other methods may be used to categorize the sensed magnetic field readings at the coils, and the processor will use the information to determine the location and orientation of the wire.

Further, in one embodiment, the test instrument may not even provide individual coil readings to the user to minimize confusion. The screen of the instrument can simply provide a graphical indication of the sensed wire relative to the instrument.

Once the receiver has been initialized, the test instrument can be used to sense the energized wire in an area where the exact location of the wire is unknown. The user simply places the back of the test instrument near where the wire is believed to be located. Returning to the configuration shown in FIG. 3A, the signal readings for the four coil sensors would be interpreted by the processor to be high for coils S3 and S4 and low (very close to zero) for coils S1 and S2. The readings for coils S3 and S4 is high because the coils are oriented perpendicular to the wire 305 and thus fully sense the magnetic field generated by the current in the energized wire, whereas the coils S1 and S2 are oriented in a direction perpendicular to coils S3 and S4 and sense almost none of the magnetic field generated by the current in the wire 305. Note that coils S3 and S4, the high reading coils, sandwich the position of the wire relative to the sensor array. On a screen of the test instrument, the sensor array is shown (as a circle 701) centered over a straight line 702 representing the wire that is vertical relative to the array, as shown by the example screen 705 in FIG. 7A.

Figure 3B:
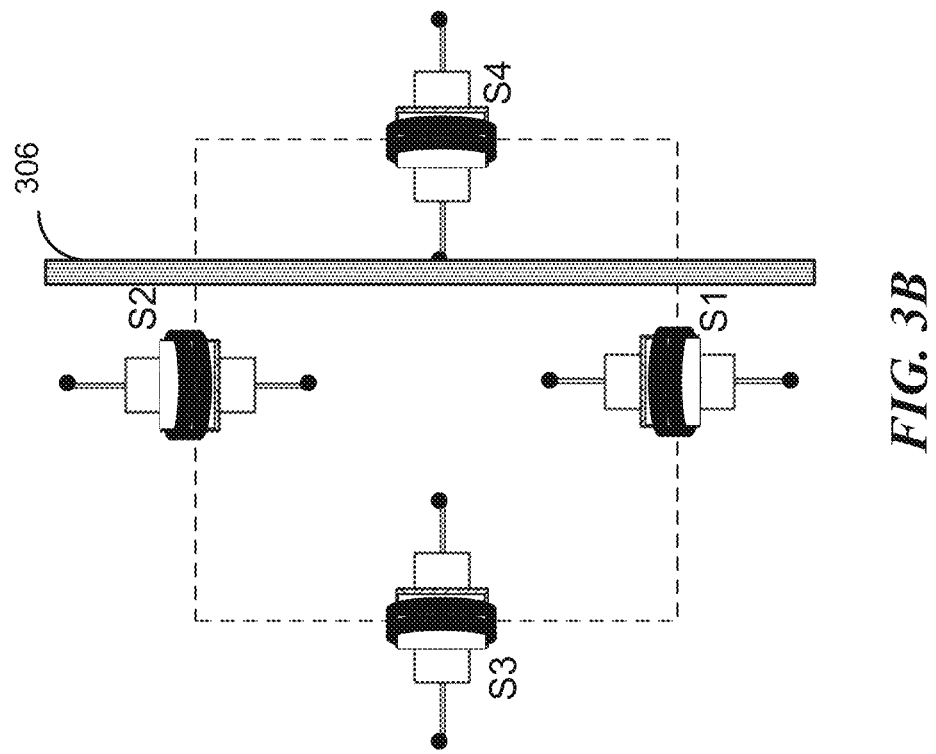
Figure 7B:

For the configuration shown in FIG. 3B, the sensor array is not centered over the wire 306, instead the wire is located offset to the right of the array, relative to the configuration shown in FIG. 3A. For this position of the array relative to the vertical wire, the signal reading for coil S4 will be high, while the readings for coils S1, S2, and S3 will be low. On a screen of the test instrument, an arrow 720 is shown pointing towards a vertical straight line 721 representing the wire, indicating that the wire is straight and vertical and that the user should move the test instrument to the right to center the test instrument over the location of the wire, as shown by the example screen in FIG. 7B.

Figure 3C:
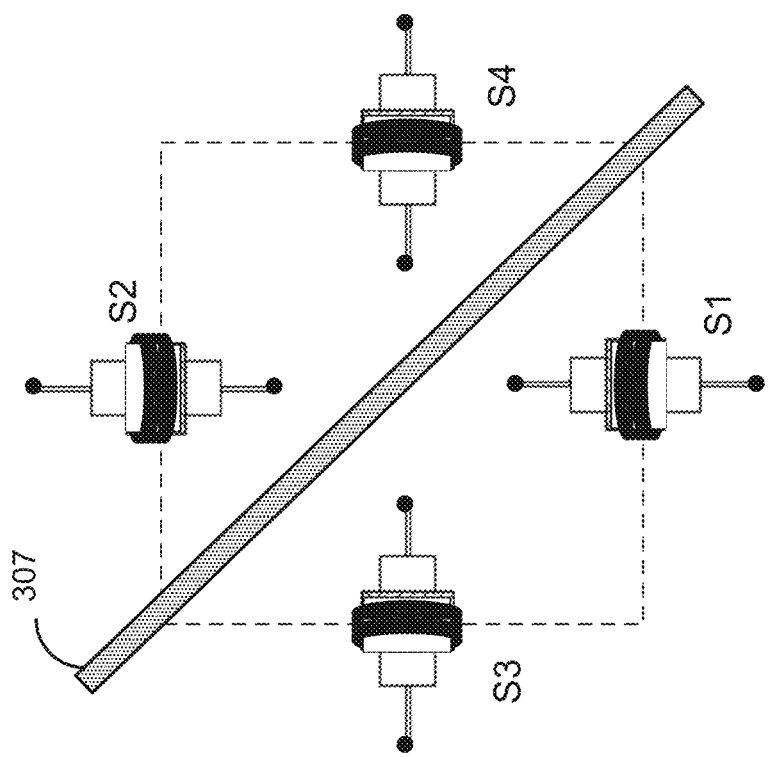

For the configuration shown in FIG. 3C, the energized wire is a straight wire that is positioned at an angle relative to the sensor array. For this position of the array relative to the angled wire, the signal readings for all of the coils will be in the middle range.

Figure 7C:

For the configuration shown in FIG. 3D, the energized wire is a straight wire that is positioned at an angle relative to the sensor array, and the center of the array is shifted downwards relative to the wire. For this position of the array relative to the angled wire, the signal readings for coils S2 and S4 will be high, while the readings for coils S1 and S3 will be low. On a screen of the test instrument, an arrow 725 is shown pointing diagonally upwards towards an angled straight line 726 representing the wire, indicating that the user should move the test instrument up and to the right to center the test instrument over the location of the wire, as shown by the example screen in FIG. 7C.

Figure 4A:
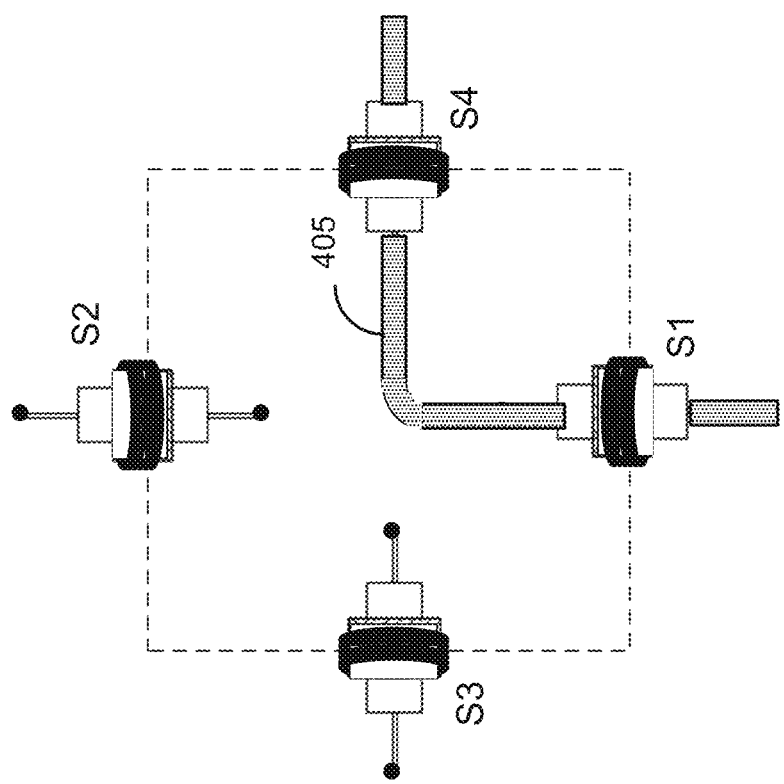

For the configuration shown in FIG. 4A, the energized wire is a wire bent to the right, where the bend is centered within the sensor array. For this position of the array relative to the bent wire, the signal readings for coils S1 and S4 will be in the middle range, while the readings for coils S2 and S3 will be low.

For the configuration shown in FIG. 4B, the energized wire is a wire bent to the right, but is located higher relative to a center of the sensor array than the configuration shown in FIG. 4A. For this position of the array relative to the bent wire, the signal readings for coils S2, S3, and S4 will be high, while the reading for coil S1 will be low.

Figure 4C:
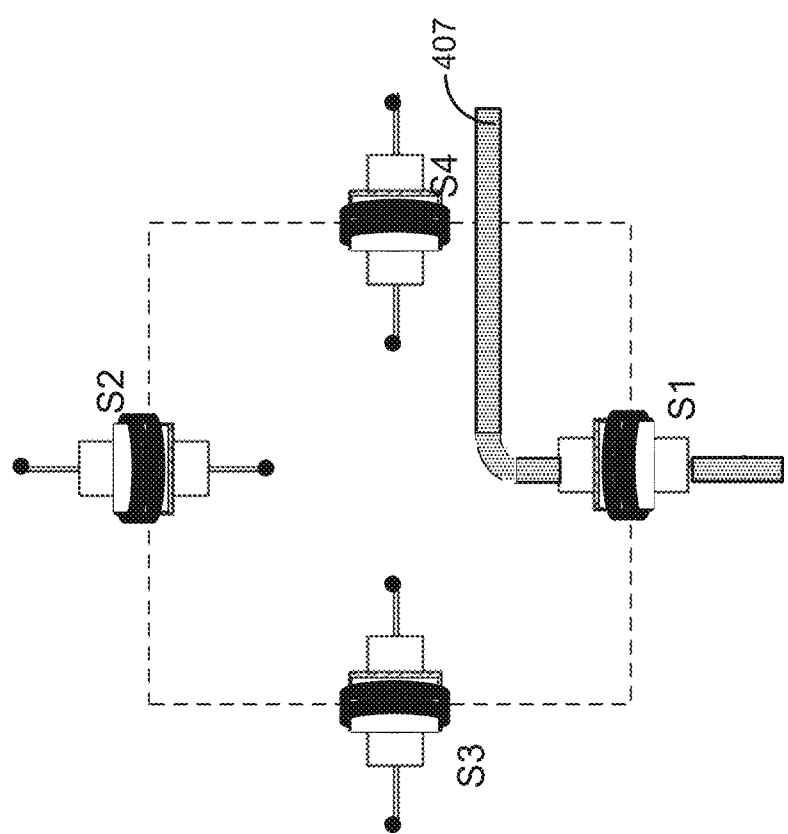

For the configuration shown in FIG. 4C, the energized wire is a wire bent to the right, but is located lower relative to a center of the sensor array. For this position of the array relative to the bent wire, the signal reading for coil S1 will be high, while the readings for coils S2, S3, and S4 will be low.

Because the four-coil sensor array is symmetrical, it is straightforward to determine from the readings for the vertical wire the readings for a wire oriented horizontally relative to the sensor array. Similarly, it is straightforward to determine the readings for a straight wire angled in the opposite direction from the straight angled wire readings given above, and to determine the readings for a wire bent to the left from the readings for the wire bent to the right given above.

The coil readings corresponding to different wire configurations relative to the sensor array can be stored in a memory in a test instrument, and the processor in the test instrument can use this information to determine from readings taken by a user the location and orientation of the wire relative to the sensor array. If there are degenerate cases where the stored readings from the coil sensors indicate more than one possible wire location and orientation, the test instrument can request that the user move the instrument, perhaps in a certain direction, to take another set of coil readings. Using two or more sets of coil readings and/or knowing the direction in which the user moved the instrument can unambiguously determine the location and orientation of the wire. Using this information, the test instrument can then graphically display the information to the user on the screen, such as shown in the example screens in FIGS. 7A-7C.

FIG. 7A shows example inputs and indicators on the user interface of the test instrument. The test instrument inputs include a pushbutton 760 for entering a selection and pushbuttons 759a, 759b, 759c, 759d for navigation selection. Button 758 is used for selecting a non-contact voltage detection mode. Buttons 749a and 749b increase and decrease the volume emitted by the test instrument, respectively.

Inputs can be selected using the touchscreen 705 of the test instrument. Input 757 allows a user to select a home display on the touchscreen. Input 761 is a sensitivity level selector; input 762 is a frequency selector for the signal generated and transmitted down the wire to be traced; input 763 is a sensor selector; and input 764 selects a help menu.

Indicators on the test instrument include a breaker detection LED 750. Indicator 753 shows the sensitivity level, e.g. from 1 to 10. Indicator 754 shows the frequency of the signal used by the test instrument, e.g. 6 kHz. In one embodiment, different frequencies generated by the test instrument can be selected. Indictor 755 shows the type of sensor that is in use. Example sensors that can be used by the test instrument include, but are not limited to, a smart electromagnetic sensor (corresponding to the indication of sensor #1 on the screen) a breaker sensor (labeled as sensor #2), or a non-contact voltage sensor (labeled as sensor #3). Smart electromagnetic sensors are used with the sensor arrays described herein. Indicator 756 provides the signal strength.

The screen 705 has a display bar near the top. Indicator 752 in the bar near the top of the screen 705 shows that an energized line is being detected by the test instrument.

The values in the display shown in FIG. 7A show that the receiver of the test instrument is set up to detect an energized line carrying a modulated 6 kHz signal. The sensitivity is set to level 1, and the sensor in use is sensor number 1 (smart electromagnetic sensor array). Further, the test instrument is directly over a detected vertical wire, and the signal strength is almost at the highest level.

Figure 5A:
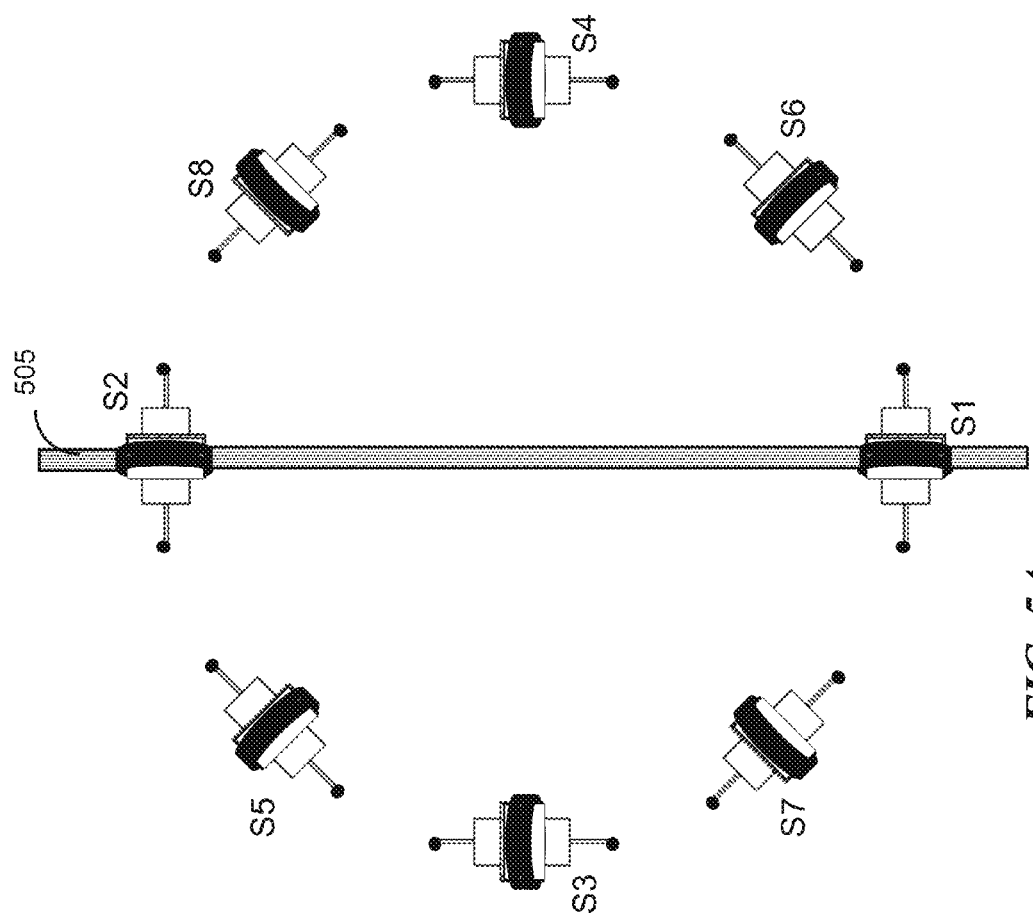
FIGS. 5A-5B show example straight wire configurations that an eight-coil sensor array may encounter.
Figure 5B:
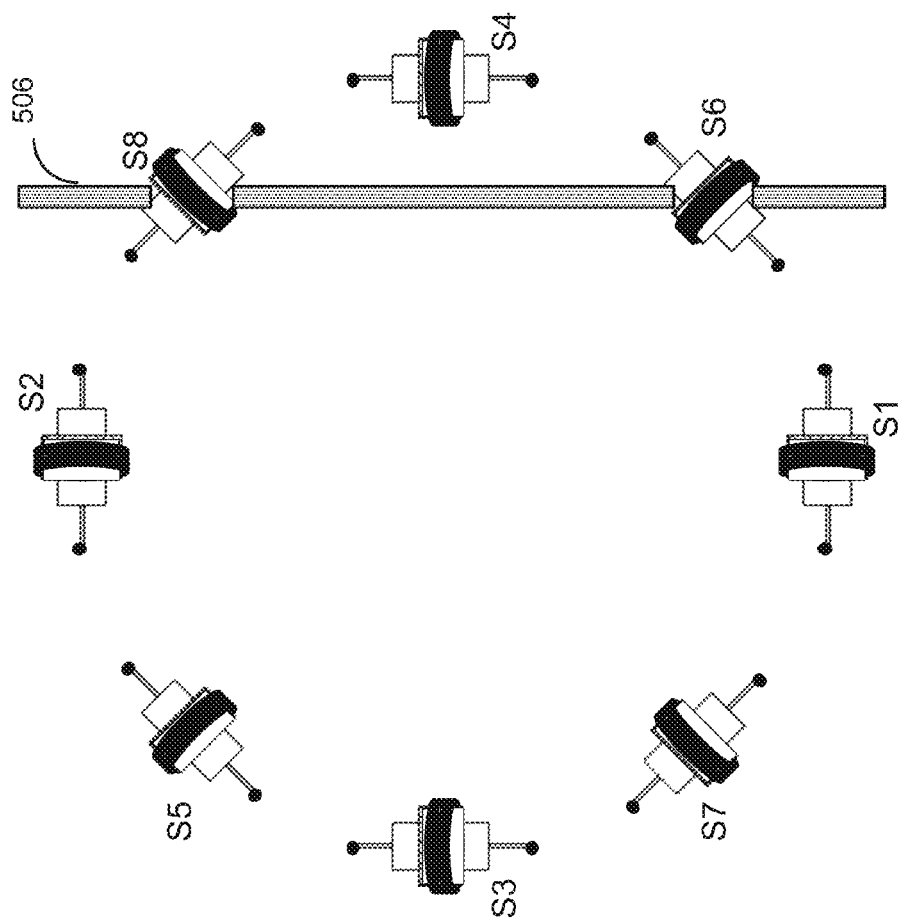

FIGS. 5A-5B show example straight wire configurations that an eight-coil sensor array may encounter. For the configuration shown in FIG. 5A with the sensor array centered over a vertical energized wire, the coil readings are as follows: coils S1 and S2 are high, and the rest of the coil readings are low. For the configuration shown in FIG. 5B with the vertical energized wire located towards the right side of the sensor array, the coil readings are as follows: coils S1, S2, S6, and S8 are in the middle range, and the rest of the coil readings are low.

Not as many configurations are shown for the eight-coil configuration as the four-coil configuration, but a person skilled in the art will recognize that similar configuration readings can be taken with the eight-coil configuration and used by the processor to determine the location and orientation of the wire relative to the sensor array and subsequently display the information to the user on a test instrument screen.

A similar process can be used for other sensor coil configurations to determine coil readings that correspond to particular wire locations and orientations relative to the sensor array, and the processor can use that information to determine live wire locations and orientations for displaying to the user.

Figure 8:
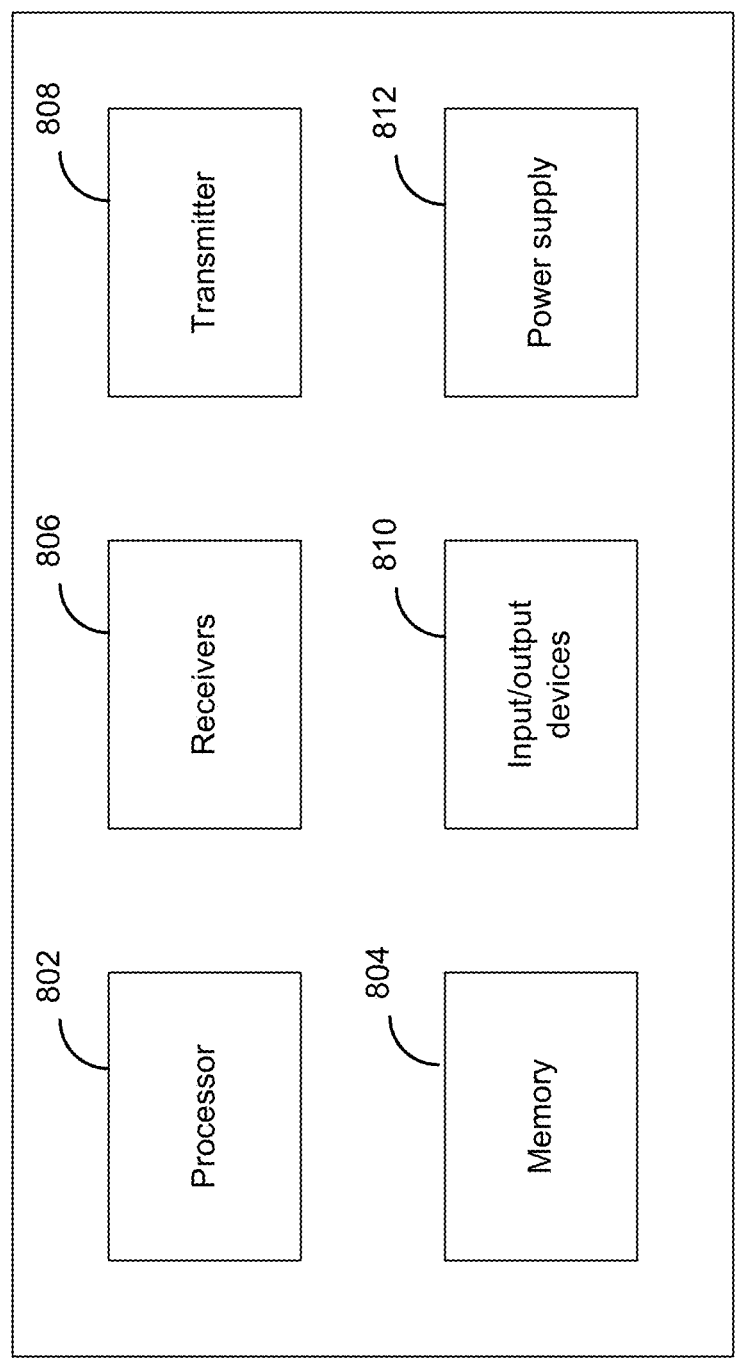
FIG. 8 depicts a block diagram illustrating an example of a test instrument for determining a location and orientation of a wire.

FIG. 8 depicts a block diagram of an example of a test instrument for determining a location and orientation of a wire. The test instrument can include a processor 802, one or more memory 804, a plurality of receivers 806, a transmitter 808, input/output devices 810, and power supplies 812.

The transmitter 808 generates a modulated signal for transmitting down the wire to be detected. Multiple receivers 806 are configured in a sensor array to detect the magnetic field induced by the modulated signal in the wire at multiple locations. Each receiver can include a sensor, a bandpass filter, and an amplifier.

A processor 802 is used to run test instrument applications, including determining the location and orientation of the wire from the magnetic field strength readings detected by the receivers 806. In one embodiment, the memory 804 stores relative field strength readings for the multiple receivers that correspond to different locations and orientations of a wire with respect to the sensors. The processor 802 can compare the stored readings to the measured readings to determine the location and orientation of the wire to be detected. Memory 804 can include, but is not limited to, RAM, ROM, and any combination of volatile and non-volatile memory.

The input/output devices 810 can include, but are not limited to, triggers to start and stop the test instrument or to initiate other test instrument functions, visual displays, speakers, and communication devices that operate through wired or wireless communications. In particular, the processor 802 can display the location and orientation of the wire relative to the sensors of the receivers on an output device 810. A power supply 812 can include, but is not limited to, a battery.

Figure 9:
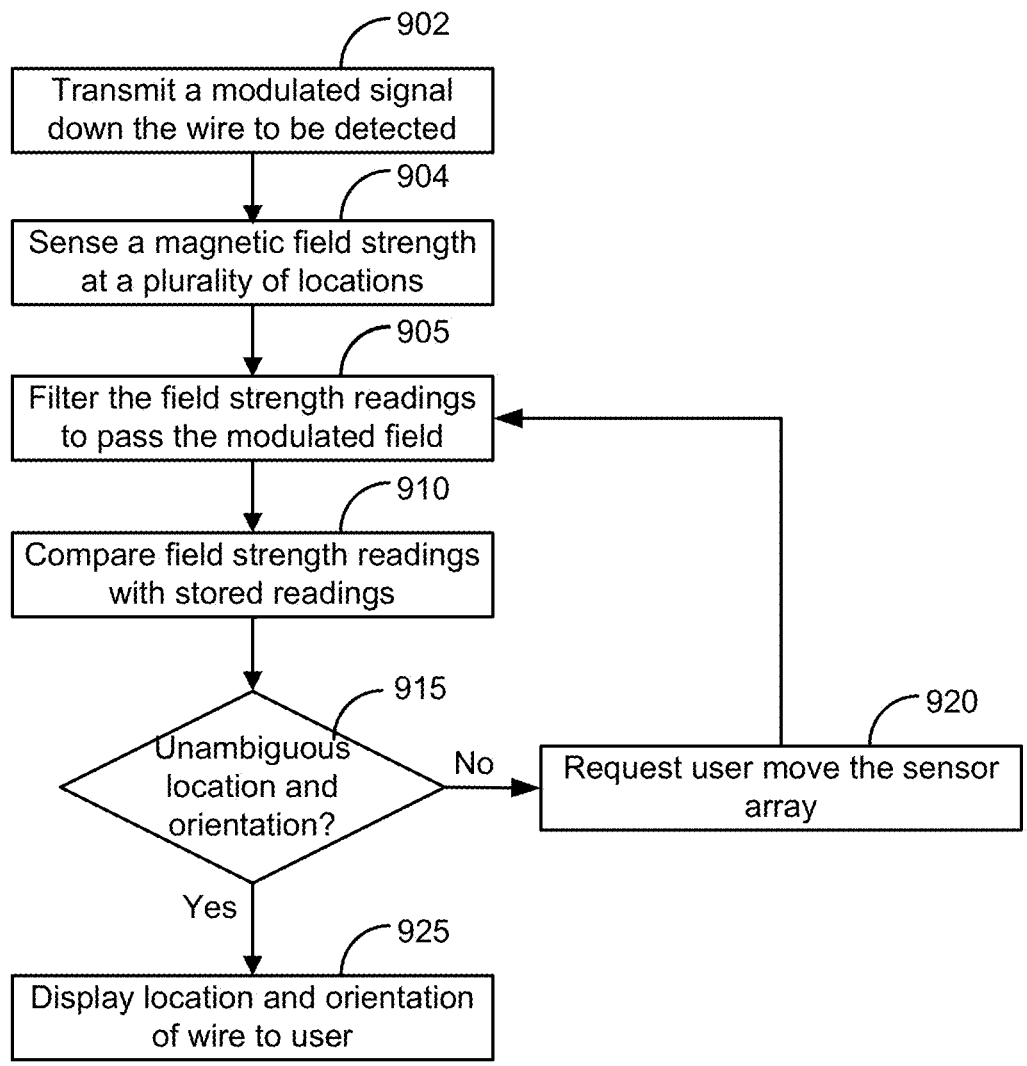
FIG. 9 depicts a flow diagram illustrating an example process of determining a location and orientation of a wire.

FIG. 9 depicts a flow diagram illustrating an example process of determining a location and orientation of a wire. At block 902, the system transmits a modulated signal down the wire to be detected. The signal is modulated so that the magnetic field induced by the signal in the wire can be differentiated from the magnetic field sensed by the sensor array that arises from other signals in the wire or other sources.

At block 904, the system senses a magnetic field strength at multiple locations simultaneously using a sensor array having multiple sensors. The sensors should be reasonably close to the wire to be detected to ensure that the magnetic field induced by a signal traveling in the wire is detected.

Then at block 905, the system filters the field strength readings from the sensor array to pass only the portion of the readings of the magnetic field that is induced by the modulated signal transmitted down the wire at block 902.

Then at block 910, the system compares the readings of the sensors in the sensor array with stored readings. The stored readings provide the magnetic field strength readings at the multiple sensors that correspond to various locations and orientation of a wire.

At decision block 915, the system determines if the readings of the sensors correspond to stored readings that provide an unambiguous determination of the location and orientation of the wire relative to the sensor array. If the readings are not unambiguous (block 915—No), at block 920 that system requests that the user move the sensor array from its current location. The process then returns to block 905 to sense the magnetic field strength at multiple locations for the new sensor array location. At block 910, the system again compares the readings of the sensors in the new location of the sensor array with stored readings and also uses the readings of the sensors in the previous location to determine the location and orientation of the wire.

If the readings are unambiguous (block 915—Yes), at block 925 the system displays the location and orientation of the wire relative to the sensor array to the user.

Conclusion

Unless the context clearly requires otherwise, throughout the description and the claims, the words "comprise," "comprising," and the like are to be construed in an inclusive sense (i.e., to say, in the sense of "including, but not limited to"), as opposed to an exclusive or exhaustive sense. As used herein, the terms "connected," "coupled," or any variant thereof means any connection or coupling, either direct or indirect, between two or more elements. Such a coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above Detailed Description of examples of the invention is not intended to be exhaustive or to limit the invention to the precise form disclosed above. While specific examples for the invention are described above for illustrative purposes, various equivalent modifications are possible within the scope of the invention, as those skilled in the relevant art will recognize. While processes or blocks are presented in a given order in this application, alternative implementations may perform routines having steps performed in a different order, or employ systems having blocks in a different order. Some processes or blocks may be deleted, moved, added, subdivided, combined, and/or modified to provide alternative or subcombinations. Also, while processes or blocks are at times shown as being performed in series, these processes or blocks may instead be performed or implemented in parallel, or may be performed at different times. Further any specific numbers noted herein are only examples. It is understood that alternative implementations may employ differing values or ranges.

The various illustrations and teachings provided herein can also be applied to systems other than the system described above. The elements and acts of the various examples described above can be combined to provide further implementations of the invention.

Any patents and applications and other references noted above, including any that may be listed in accompanying filing papers, are incorporated herein by reference. Aspects of the invention can be modified, if necessary, to employ the systems, functions, and concepts included in such references to provide further implementations of the invention.

These and other changes can be made to the invention in light of the above Detailed Description. While the above description describes certain examples of the invention, and describes the best mode contemplated, no matter how detailed the above appears in text, the invention can be practiced in many ways. Details of the system may vary considerably in its specific implementation, while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed in the specification, unless the above Detailed Description section explicitly defines such terms. Accordingly, the actual scope of the invention encompasses not only the disclosed examples, but also all equivalent ways of practicing or implementing the invention under the claims.

While certain aspects of the invention are presented below in certain claim forms, the applicant contemplates the various aspects of the invention in any number of claim forms. For example, while only one aspect of the invention is recited as a means-plus-function claim under 35 U.S.C. §112, sixth paragraph, other aspects may likewise be embodied as a means-plus-function claim, or in other forms, such as being embodied in a computer-readable medium. (Any claims intended to be treated under 35 U.S.C. §112, ¶ 6 will begin with the words "means for.") Accordingly, the applicant reserves the right to add additional claims after filing the application to pursue such additional claim forms for other aspects of the invention.

What is claimed is:

1. A system for determining a location and an orientation of a wire, the system comprising:
   a plurality of sensors located at a respective plurality of locations that are fixed within the system, each sensor in the plurality of sensors being located spatially separate from the other sensors, wherein the sensors are configured to sense a strength of a magnetic field induced by a signal in the wire at the plurality of locations;
   a processor configured to determine the location and the orientation of the wire relative to the plurality of sensors based upon the sensed strength of the magnetic field at the plurality of locations and provide the determined location and orientation of the wire to a user, wherein the determined location and orientation are indicative of both a position of the wire and an angular orientation of the wire with respect to the fixed locations of the plurality of sensors; and
   a display configured to graphically display the determined location and orientation of the wire relative to the fixed locations of the plurality of sensors.

2. The system of claim 1, wherein the sensors in the plurality of sensors are induction coil sensors.

3. The system of claim 1, wherein the plurality of sensors comprises four induction coil sensors, wherein one of the four sensors is positioned at or near a midpoint of each of the four sides of a square.

4. The system of claim 1, wherein the sensors in the plurality of sensors are positioned substantially equidistant around a circle.

5. The system of claim 1, wherein the plurality of sensors comprises three sensors positioned substantially at the vertices of a triangle.

6. The system of claim 1, further comprising:
   a transmitter configured to transmit the signal down the wire, wherein the signal is modulated at a signal frequency; and
   a plurality of filters each configured to receive and filter an electrical signal from one of the plurality of sensors and transmit frequencies near the signal frequency of the modulated signal, wherein the electrical signal corresponds to a total sensed magnetic field by a respective one of the plurality of sensors.

7. The system of claim 6, further comprising a plurality of amplifiers configured to amplify the filtered signals, wherein a gain of each of the plurality of amplifiers is adjusted with automatic gain control circuitry so that the filtered signals are amplified near the middle of an operating range of the processor.

8. The system of claim 1, further comprising a memory configured to store readings at each of the plurality of sensors for a plurality of locations and orientations of a test wire relative to the plurality of sensors, wherein the processor determines the location and orientation of the wire further based on the stored readings.

9. A method of determining a location and an orientation of a wire, the method comprising:
   sensing a strength of a magnetic field induced by a signal in the wire using a plurality of sensors in a system, wherein the sensors are located at a respective plurality of locations that are fixed within the system;
   determining the location and the orientation of the wire relative to the plurality of sensors based upon the sensed strength of the magnetic field at the plurality of locations, wherein determining the location and orientation of the wire includes comparing the sensed strength of the magnetic field at the plurality of locations with readings previously stored in a memory, the stored readings providing indications of a plurality of locations and orientations of a test wire relative to the fixed locations of the plurality of sensors, and determining the location and orientation of the wire based on the comparison with the stored readings, and wherein the determined location and orientation are indicative of both a position of the wire and an angular orientation of the wire with respect to the fixed locations of the plurality of sensors; and
   providing to a user the determined location and orientation of the wire relative to the fixed locations of the plurality of sensors.

10. The method of claim 9, wherein the sensors in the plurality of sensors are induction coil sensors.

11. The method of claim 9, wherein providing the determined location and orientation comprises displaying the determined location and orientation of the wire on a display relative to the fixed locations of the plurality of sensors.

12. The method of claim 9, further comprising:
   transmitting the signal down the wire, wherein the signal is modulated at a signal frequency; and
   filtering an electrical signal from each of the plurality of sensors to pass frequencies near the signal frequency of the modulated signal, wherein the electrical signal from a respective sensor of the plurality of sensors corresponds to the sensed magnetic field at the respective sensor.

13. The method of claim 12, further comprising amplifying the filtered signals and adjusting an amplifying gain using automatic gain control circuitry so that the filtered signals are amplified near the middle of an operating range of one or more components used to determine the location and the orientation of the wire.

14. The method of claim 12, further comprising amplifying the filtered signals, wherein an amplifying gain is adjusted by the user.

15. A test instrument for determining a location and an orientation of a wire, comprising:
   a plurality of receivers arranged in an array, wherein the receivers are configured to sense a strength of a magnetic field induced by a signal in the wire at a plurality of locations that are fixed within the array, each receiver in the array being located spatially separate from the other receivers;
   a processor configured to determine the location and the orientation of the wire relative to the plurality of receivers based upon the sensed strength of the magnetic field at the plurality of locations, wherein the determined location and orientation are indicative of a position of the wire with respect to the plurality of receivers and an angular orientation of the wire with respect to the fixed locations of the plurality of receivers; and a display configured to display the determined location and orientation of the wire relative to the fixed locations of the plurality of receivers, wherein each of the plurality of receivers further includes an amplifier to amplify the filtered electrical signal, and wherein a gain of the amplifier is controlled using automatic gain control circuitry so that the filtered sink are amplified near the middle of an operating range of the processor.

16. The test instrument of claim 15, wherein each of the plurality of receivers includes an induction coil sensor.

17. The test instrument of claim 16, wherein each induction coil sensor converts the sensed magnetic field to an electrical signal, wherein the electrical signal is modulated at a modulation frequency, and wherein each of the plurality of receivers further includes a bandpass filter configured to filter the electrical signal to pass frequencies near the modulation frequency.

18. The test instrument of claim 17, wherein the gain of the amplifier is alternatively controlled by a user.

19. The test instrument of claim 15, further comprising a memory configured to store readings of the strength of the magnetic field at each of the receivers for a plurality of locations and orientations of a test wire relative to the plurality of receivers, wherein the processor determines the location and orientation of the wire to be detected further based on the stored readings.

20. The system of claim 1, wherein the processor is further configured to directionally guide a user of the system to reposition the plurality of sensors with respect to the wire to center the plurality of sensors over the location of the wire.

21. The method of claim 9, further comprising requesting that the plurality of sensors be moved with respect to the wire, and thereafter redetermining the location and orientation of the wire relative to the fixed locations of the plurality of sensors based upon the sensed strength of the magnetic field at the new plurality of locations of the sensors, wherein redetermining the location and orientation of the wire includes comparing the sensed strength of the magnetic field at the new plurality of locations with the readings previously stored in the memory and determining the location and orientation of the wire based on the comparison with the stored readings and the previously-determined location and orientation of the wire relative to the new plurality of locations of the sensors.

22. The method of claim 1, further comprising directionally guiding the user to reposition the plurality of sensors with respect to the wire to center the plurality of sensors over the location of the wire.

\* \* \* \* \*